(12) United States Patent
Ravi

(10) Patent No.: US 7,424,692 B1
(45) Date of Patent: Sep. 9, 2008

(54) METHODS TO FIND WORST-CASE SETUP AND HOLD RELATIONSHIP FOR STATIC TIMING ANALYSIS

(75) Inventor: Ajay K Ravi, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/279,552

(22) Filed: Apr. 12, 2006

(51) Int. Cl.
G06F 9/45 (2006.01)
G06F 17/50 (2006.01)

(52) U.S. Cl. .......................................... 716/6
(58) Field of Classification Search ............. 716/6
See application file for complete search history.

(56) References Cited

U.S. PATENT DOCUMENTS

| 7,206,958 B1* | 4/2007 | Sutherland et al. .......... 713/500 |
| 2004/0125487 A9* | 7/2004 | Sternad et al. ................ 360/65 |
| 2005/0119186 A1* | 6/2005 | Larson .......................... 514/16 |
| 2007/0089076 A1* | 4/2007 | Amatangelo ................... 716/6 |

* cited by examiner

Primary Examiner—Jack Chiang
Assistant Examiner—Suresh Memula
(74) Attorney, Agent, or Firm—Martine Penilla & Gencarella, LLP

(57) ABSTRACT

A method is provided for determining a worst-case single cycle setup time between a first and second clock domain. First, an offset time of a second clock domain with respect to a first clock domain is normalized. A base period of the first clock domain and the second clock domain is then obtained. Next, a first greatest common denominator (GCD) shared by the first and second clock domains and the normalized second clock domain offset time is factored. Then, a reduced offset time and a reduced offset time size factor are substituted into an expression representing a relationship between the first and second clock domains. A second GCD shared by the first and second clock domains is factored from the expression and a modulus value of the reduced offset time and the second GCD is computed. Based on the modulus value, the worst-case single cycle setup time is computed.

25 Claims, 3 Drawing Sheets

METHODS TO FIND WORST-CASE SETUP AND HOLD RELATIONSHIP FOR STATIC TIMING ANALYSIS

BACKGROUND

High performance integrated circuits have traditionally been characterized by the clock frequency at which they operate. Gauging a circuit design's ability to operate at the specified frequency requires having the capability of measuring timing delays during the design process. Static timing analysis is a method of computing the expected process delays of a digital circuit without requiring circuit simulation.

Static timing analysis of sequential circuits requires the computation of the minimum and maximum delay requirements between every pair of source and destination registers that have a valid combinational path between them. These delay requirements depend on clock waveform characteristics feeding the registers. As such, delay requirements ultimately depend on the worst-case single cycle setup and hold time between pairs of clocks.

The worst-case single cycle setup time between a source clock and destination clock is defined as the smallest delay difference between the destination clock edge that latches the data, and the preceding source clock edge that launches the data. The base period is the minimum time after which two clock waveforms repeat and can determined by calculating the least common multiple (LCM) of the two clock periods.

The worst-case single cycle hold time is defined as the smallest non-negative difference between a source clock edge, and the destination clock edge that either precedes the source clock edge or occurs at the same time as the source clock edge. For clocks without a relative offset between them, the worst-case single cycle hold time is always zero.

Existing methods to determine the worst-case single cycle setup and hold times exhaustively check all valid setup and hold relationships across the base period of two clock periods. These methods require time proportional to the base period to determine these relationships. The amount of time spent to determine the worst-case setup and hold relationships for circuits with large base periods can be very large and can result in costly delays to completing a circuit design. Therefore, what is needed is a method to directly compute the worst-case single cycle setup and hold time without having to exhaustively check each valid setup and hold relationship combination.

SUMMARY

Embodiments of the present invention provide methods to find the worst-case single cycle setup time and the worst-case single cycle hold time between a source and destination clock. The methods also permit the computation of launching edge and latching edge times with either the worst-case single cycle setup time or the worst-case single cycle hold time.

It should be appreciated that the present invention can be implemented in numerous ways, such as a process, an apparatus, a system, a device or a method on a computer readable medium. Several inventive embodiments of the present invention are described below.

In one embodiment a method for determining a worst-case single cycle setup time between a first and second clock domain begins by normalizing an offset time of a second clock domain with respect to a first clock domain. The method converts the problem of calculating the worst-case single cycle setup time to an integer linear program problem in which a modulus value is computed. The method computes the worst-case single cycle setup time from the modulus value.

In another embodiment, a method for determining a worst-case single cycle hold time between a first and second clock domain begins by normalizing an offset time of a first clock domain with respect to a second clock domain. The method converts the problem of calculating the worst-case single cycle hold time to an integer linear program problem in which a modulus value is computed. The method computes the worst-case single cycle hold time from the modulus value.

In accordance with yet another embodiment of the invention, a system for designing an IC is provided. The system includes a bus, a memory, and a processor in communication with the memory through the bus. The processor is operable to execute worst-case setup and hold logic which allow the system to compute a worst-case single cycle setup and hold time and a launching edge time and a latching edge time Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The present invention relates to directly computing a worst-case single cycle setup and hold time between a source clock and a destination clock in an integrated circuit design. The methods presented transform the problem into an integer linear program problem in two variables which represent the launching and latching edge times of two clocks. Number theory techniques are then used to efficiently compute the setup and hold relationships and the corresponding launching and latching edge times. The disclosed methods compute launching and latching edge times in time proportional to the $\log_2$ of the base period. Therefore, these methods are capable of handling arbitrarily large clock periods without incurring substantial delays to circuit design implementation.

It will be obvious, however, to one skilled in the art, that the present invention may be practiced without some or all of these specific details. In other instances, well known process operations have not been described in detail in order not to unnecessarily obscure the present invention.

Figure 1:
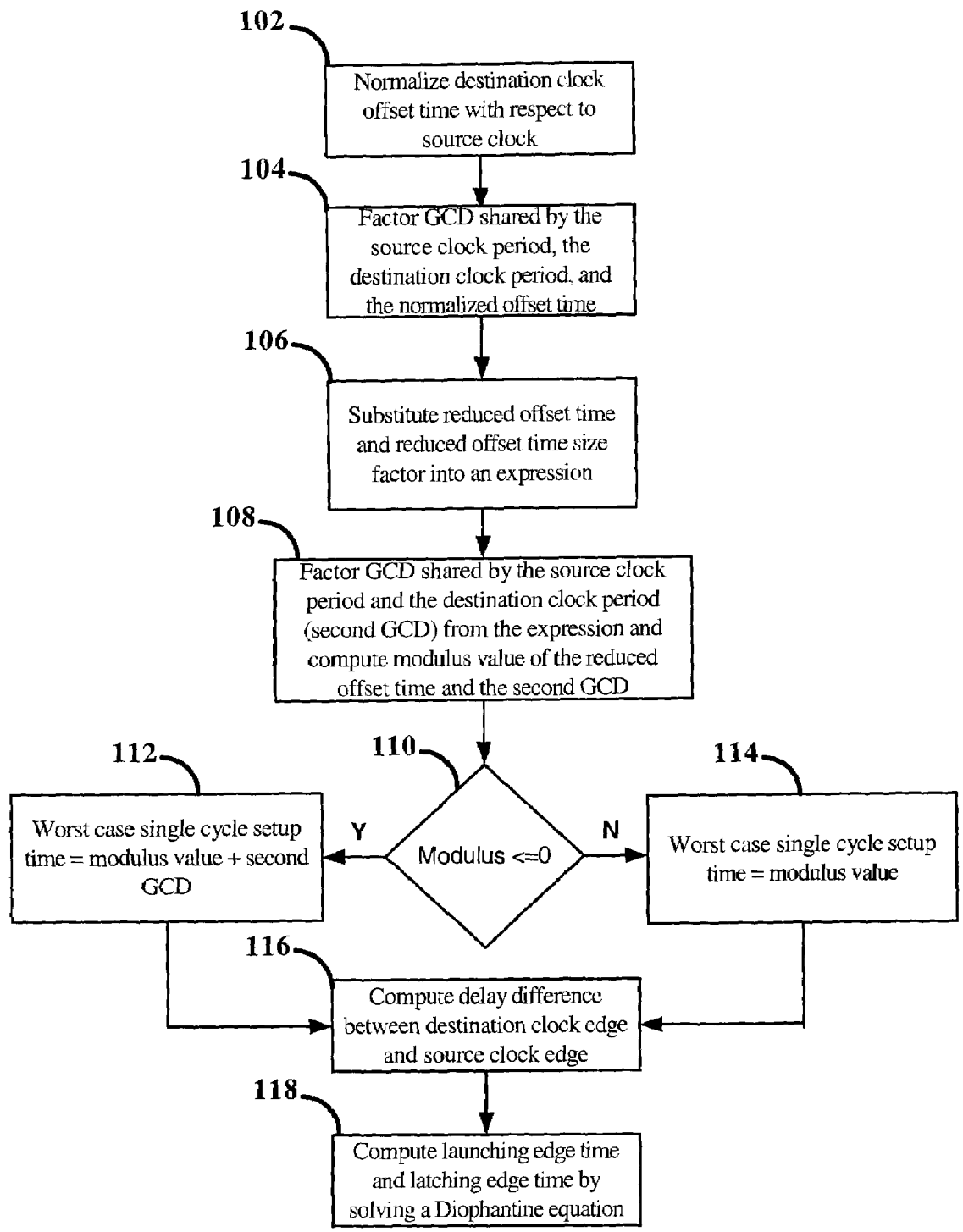
FIG. 1 is a flowchart illustrating the operations to compute a worst-case setup time, a launching edge time, and a latching edge time in accordance with one embodiment of the invention.

FIG. 1 is a flowchart illustrating the operations to compute a worst-case setup time, a launching edge time, and a latching edge time in accordance with one embodiment of the invention. The method begins with operation 102 in which the offset time of the destination clock is normalized with respect to the source clock offset time. This normalization in essence translates the destination clock offset time to a time that is relative to the source clock offset time. The normalization simplifies the problem of computing the worst-case setup time by transforming the problem as if the source clock offset time was zero. The normalized offset time is obtained by subtracting the source clock offset time from the destination clock offset time.

The method continues with operation 104 in which a greatest common denominator (GCD) shared by the source clock period, the destination clock period, and the normalized offset time is factored. The factoring divides the GCD out of the source clock period, the destination clock period and the normalized offset. Factoring out the GCD reduces the calculation of the worst-case single setup time to the simplest number factors which will obtain the same worst-case single cycle setup time answer. Essentially, the final answer requires multiplying the computed worst-case setup time for the simpler problem with the factor that was factored out.

In operation 106 a reduced offset time and a reduced offset time size factor are substituted into an expression representing the relationship between the source clock time and the destination clock. Within this expression, the source clock period, the destination clock period, and the normalized destination are constants. The reduced offset time is computed such that its absolute value is less than either the source clock period or the destination clock period. The calculation of the reduced offset time is dependent on whether the source clock period is greater than the destination clock period.

If the source clock period is greater than the destination clock period, the reduced offset time is obtained from the modulus of the normalized offset time and the period of the destination clock. The reduced offset time size factor can be computed from the normalized offset time divided by the destination clock period. The reduced offset time size factor in this case represents the number of times the reduced offset time is greater than the destination clock period. If the destination clock period is greater than the normalized offset time, then the reduced offset time size factor is zero.

If the source clock period is not greater than the destination clock period, the reduced offset time is obtained from the modulus of the normalized offset time and the source clock period. The reduced offset time size factor can then be computed from the normalized offset time divided by the source clock period. The reduced offset time size factor in this situation represents the number of times the reduced offset time is greater than the source clock period.

Referring back to FIG. 1, in operation 108 a GCD shared by the source clock period and the destination clock period is factored from the expression. The factoring includes computing a new offset time in terms of the GCD of operation 108. This new offset time can be obtained by rewriting the reduced offset time as the sum of the new offset time multiplied by the GCD computed in operation 108 and a modulus value of the reduced offset time and the GCD of operation 108.

After operation 108 completes, the modulus value computed in operation 108 is checked in operation 110. If the modulus value is less than or equal to zero, the method proceeds to operation 112 where the worst-case single cycle setup is computed from the modulus value added to the GCD computed in operation 108. If the modulus value is not less than or equal to zero, the method proceeds to operation 114 where the worst-case single cycle setup is equated to the modulus value. Because the computed worst-case single time value is factored by the GCD of operation 104, the value of the worst-case single setup time is multiplied by the GCD of operation 104 before the value is returned to a user.

After the worst-case single cycle setup time has been computed, the method proceeds onto operation 116 where a delay difference is assigned between the destination clock edge and the source clock edge. The value of the delay difference is assigned a value of 0 if the modulus computed in operation 108 is greater than 0. Otherwise, the value of the delay difference is assigned a value of one.

The method completes in operation 118 in which the launching edge time and the latching edge times are computed. The latching and launching edge times can be computed by using a greatest common divisor method as applied to two numbers that are relatively prime. This method is also known as the extended Euclidean method. To compute the launching and latching edge times, the source clock period and the destination clock period are input into the greatest common divisor method. The greatest common divisor method then solves a Diophantine equation in order to compute the latching and launching edge times. By way of reference, a Diophantine equation is a polynomial equation that only allows the variables to be integers. After the latching and launching edge times are computed, the values will typically need to be postprocessed. The postprocessing adjusts the computed edge times so that edge index values are positive and times values are adjusted to compensate for offset values and the base period of the source clock and the destination clock.

It should be appreciated that although operations 116 and 118 have been presented after the worst-case single cycle setup time computations of operation 112 and 114, this is not strictly an order of operation requirement. In other words, the launching and latching edge times can be computed immediately after operation 108 without affecting the computation of the worst-case single setup time.

Table 1A contains exemplary pseudo code to compute the worst-case single setup time in accordance with one embodiment of the present invention. Table 1B contains exemplary pseudo code to compute a launching edge time value and a latching edge time value in accordance with one embodiment of the present invention. Within Table 1A a first procedure computes the worst-case single setup time. The first procedure of Table 1A calls a second procedure in order to compute the latching and launching edge time values. This second procedure call is initiated in line number 10 of Table 1A and calls the procedure contained in the exemplary pseudo code of Table 1B. It should be appreciated that the second procedure does not strictly have to be collocated with the code of the first procedure. Furthermore, it should be appreciated that the procedures illustrated in Table 1A and Table 1B may be embedded in a programming library or called from separate programs in accordance with an overall program design.

TABLE 1A

Procedure Compute Setup Relationship

Inputs: PSRC, PDST, OFFSET_SRC OFFSET_DST // PSRC = period of source clock, PDST = period of destination clock, and OFFSET_SRC is the offset of source clock w.r.t time 0, OFFSET_DST is the offset of destination clock w.r.t time 0.
The goal is to find the values of source clock edge time stime and destination clock edge time dtime such that following expression has minimum positive value. The minimum positive value is the setup time.

TABLE 1A-continued

Procedure Compute Setup Relationship

PDST*dtime + OFFSET_DST − PSRC*stime − OFFSET_SRC
BEGIN
1. Let psrc = PSRC
   Let pdst = PDST
   Let offset be the relative offset between source and destination clocks, i.e the effective offset of destination clock, assuming source clock has zero offset.
Then, offset = OFFSET_DST − OFFSET_SRC // this could be negative
//now expression expr = pdst*x1 − psrc*x2 + offset, where we need to find x1 and x2.
2. lcm = LCM(psrc, pdst) // this is the base period over which both source clock and destination clock waveforms repeat
3. cg = GCD(psrc, pdst, offset) // compute cg as the GCD of the three inputs. This value is used towards computing setup relationship
4. psrc = psrc/cg // factor out cg from source clock period.
   pdst = pdst/cg // factor out cg from destination clock period
   offset = offset/cg // factor out cg from the relative offset
//expr = cg*(pdst*x1 − psrc*x2 + offset)
5. If ( psrc > pdst ) then // if source clock period is greater than destination clock period
       off_r = MOD(offset, pdst) // reduce offset to a value less than pdst
       off_q = DIV(offset, pdst) // This is the number of times offset is greater than pdst. If pdst is greater than offset, then this value is 0.
// expr = pdst*(x1 + off_q) − psrc*x2 + off_r
   else
       off_r = MOD(offset, psrc) // reduce offset to a value less than pdst
       off_q = DIV(offset, psrc) // This is the number of times offset is greater than psrc. If psrc is greater than offset, then this value is 0
// expr = pdst*x1 − psrc*(x2 − off_q) + off_r
   endif
6. offset = off_r
// At this point, |offset| is less than pdst and psrc
7. g2 = GCD(psrc, pdst)
8. Let psrc = psrc/g2
   Let pdst = pdst/g2
   Let offset_new = DIV(offset, g2)
   Let tr = MOD(offset, g2)
// i.e offset = offset new*g2 + tr
// original expr = g2*(pdst*x1 − psrc*x2) + offset
// Now replace offset by (g2*offset_new + tr) to get below expr
// expr = g2*(pdst*x1 − psrc*x2 + offset new) + tr
//Let offset = offset_new
//Let expr_new = pdst*x1 − psrctx2 + offset
//Then expr = g2*expr_new + tr
// let val represent the value of expr_new
9. If ( tr > 0) then
       val = 0
   else
       val = 1
// val is set 0 or 1 as appropriate, in order to get minimum positive value of g2*expr_new + tr
10. (stime, dtime) = FIND EDGES(psrc, pdst, offset, val)
// find the edge values stime and dtime such that pdst*dtime − psrc*stime + offset = val
11. if ( tr <= 0) then
       setup_value = tr + g2
    else
       setup value = tr
12. If ( psrc > pdst ) then
       dtime = dtime − off_q
    else
       stime = stime + off_q
    endif
13. setup value = setup value*tcg
14. stime = stime*PSRC + OFFSET_SRC
    dtime = dtime*PDST + offset + OFFSET_SRC
// dtime is now translated to the edge time (for reporting to user). This is the edge at time pdst*x1 + offset.
// Here offset = OFFSET_DST − OFFSET_SRC. Therefore adding OFFSET_SRC to it gives OFFSET_DST
15. stime = MOD(stime, lcm)
    dtime = MOD(dtime, lcm)
16. if ( stime < 0 or dtime < 0) then
       stime = stime + lcm
       dtime = dtime + lcm
    end if
17. if dtime == 0 then dtime = lcm // ensure that dtime is always greater than stime
18. Return (setup_value stime, dtime)
END

TABLE 1B

```
Procedure FIND_EDGES
BEGIN
Inputs: psrc, pdst, offset, val
If ( |offset − val| == 0) then return (pdst, psrc).
1.  (se, de) = EXTENDED_P_GCD(−psrc, pdst)
    // extended Greatest Common Divisor method as applied to two
    numbers that are relatively prime, also known as extended Euclidian
    method ( reference: Art of Computer Programming, Volume 2, by
    Donald .E. Knuth, 3rd edition, section 4.5.2.)
2.  se = se*(val − offset)
    de = de*(val − offset)
3.  se = MOD(se, pdst) // reduce to a number less than pdst
    de = MOD(de, psrc) // reduce to a number less than psrc
4.  Return (se, de)
END
```

Figure 2:
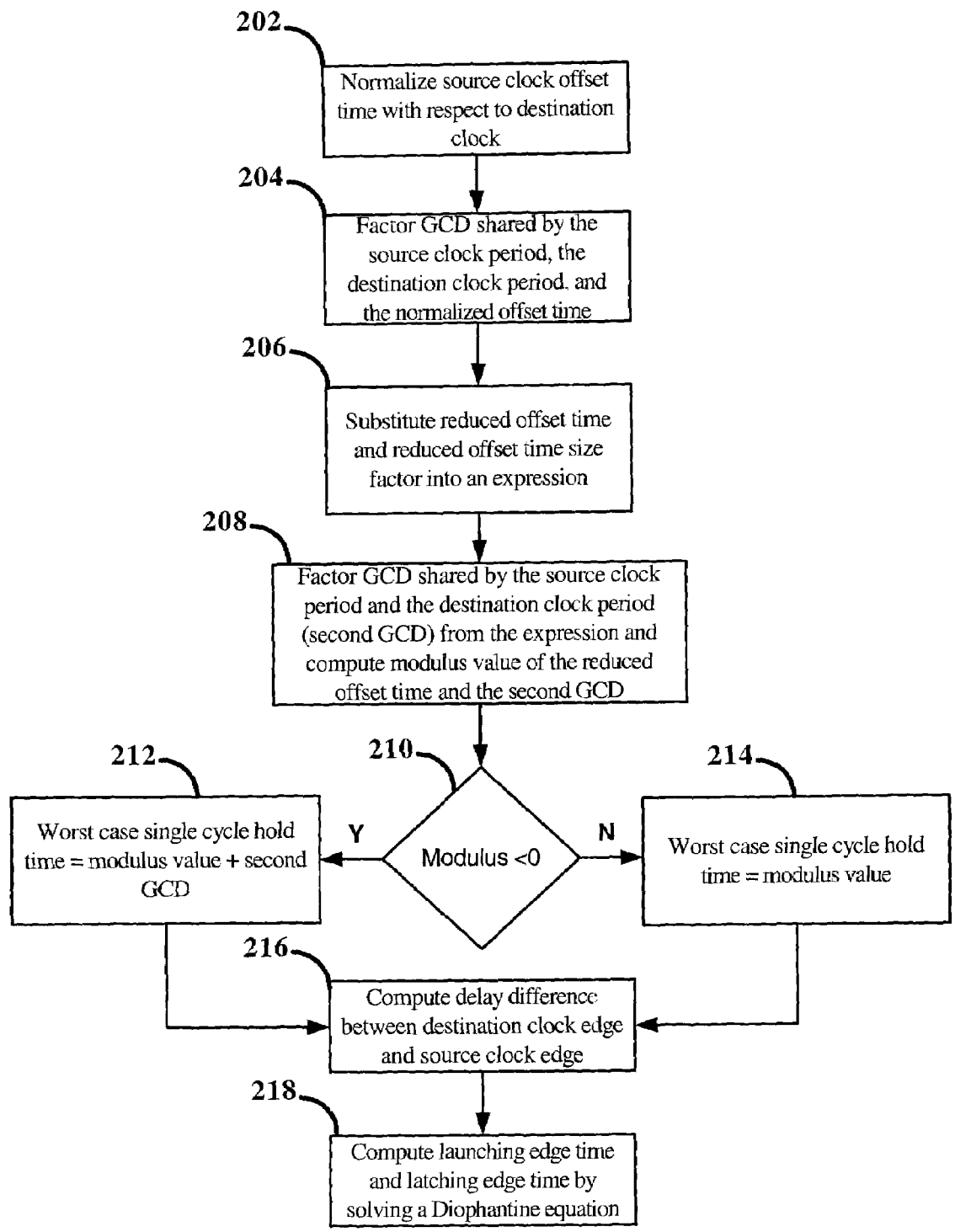
FIG. 2 is a flowchart illustrating the operations to compute a worst-case hold time, a launching edge time, and a latching edge time in accordance with one embodiment of the invention.

FIG. 2 is a flowchart illustrating the operations to compute a worst-case hold time, a launching edge time, and a latching edge time in accordance with one embodiment of the invention. The method begins with operation 202 in which the offset time of the source clock is normalized with respect to the destination clock offset time. This normalization in essence translates the source clock offset time to a time that is relative to the destination clock offset time. The normalization simplifies the problem of computing the worst-case hold time by transforming the problem as if the source clock offset time was zero. The normalized offset time is obtained by subtracting the source clock offset time from the destination clock offset time.

The method continues with operation 204 in which a greatest common denominator (GCD) shared by the source clock period, the destination clock period, and the normalized offset time is factored. The factoring divides the GCD out of the source clock period, the destination clock period and the normalized offset. Factoring out the GCD reduces the calculation of the worst-case single hold time to the simplest number factors which will obtain the same worst-case single cycle hold time. The final answer will require multiplication the computed worst-case single cycle hold time for the simplified problem with the factor that was factored out in this operation.

In operation 206 a reduced offset time and a reduced offset time size factor are substituted into an expression representing the relationship between the source clock period and the destination clock period. The reduced offset time is computed so that it is less than either the source clock period or the destination clock period. The calculation of the reduced offset time is dependent on whether the source clock period is greater than the destination clock period.

If the source clock period is greater than the destination clock period, the reduced offset time is obtained from the modulus of the normalized offset time and the destination clock period. The reduced offset time size factor can be computed from the normalized offset time divided by the destination clock period. The reduced offset time size factor in this case represents the number of times the reduced offset time is greater than the destination clock period. If the destination clock period is greater than the normalized offset, then the reduced offset time size factor is zero.

If the source clock period is not greater than the destination clock period, the reduced offset time is obtained from the modulus of the normalized offset time and the source clock period. The reduced offset time size factor can then be computed from the normalized offset time divided by the source clock period. The reduced offset time size factor in this case represents the number of times the reduced offset time is greater than the source clock period.

Referring back to FIG. 2, in operation 208 a GCD shared by the source clock period and the destination clock period is factored from the expression. The factoring includes computing a new offset time in terms of the GCD of operation 208. This new offset time can be obtained by rewriting the reduced offset time as the sum of the new offset time multiplied by the GCD computed in operation 208 and a modulus value of the reduced offset time and the GCD of operation 208.

After operation 208 completes, the modulus value computed in operation 208 is checked in operation 210. If the modulus value is less than zero, the method proceeds to operation 212 where the worst-case single cycle hold is computed from the modulus value added to GCD computed in operation 208. If the modulus value is not less than zero, the method proceeds to operation 214 where the worst-case single cycle setup is equated to the modulus value. Because the computed worst-case single time value is factored by the GCD of operation 204, the value of the worst-case single hold time is multiplied by the GCD of operation 204 before the value is returned to a user.

After the worst single cycle hold time has been computed, the method proceeds onto operation 216 where a delay difference is assigned between the destination clock edge and the source clock edge. The value of the delay difference is assigned a value of zero if the modulus computed in operation 208 is greater than or equal to 0. Otherwise, the value of the delay difference is assigned a value of one.

The method completes in operation 218 in which the launching edge time and the latching edge times are computed. Operation 218 employs the same greatest common divisor method as discussed with operation 118 of FIG. 1. The greatest common divisor method then solves a Diophantine equation in order to compute the latching and launching edge times. After the latching and launching edge times are computed, the values will typically need to be postprocessed. The postprocessing adjusts edge times so that edge index values are positive and the times values are adjusted to compensate for offset values and the base period of the source clock and the destination clock.

It should be appreciated that although operations 216 and 218 have been presented after the worst-case single cycle hold time computations of operation 212 and 214, this is not strictly an order of operation requirement. In other words, the launching and latching edge times can be computed immediately after operation 208 without affecting the computation of the worst-case single hold time.

Table 2A contains exemplary pseudo code to compute the worst-case single hold time in accordance with one embodiment of the present invention. Table 2B contains exemplary pseudo code to compute a launching edge time value and a latching edge time value in accordance with one embodiment of the present invention. Within Table 2A a first procedure computes the worst-case single hold time. The first procedure Table 2A calls a second procedure in order to compute the latching and launching edge time values. This second procedure call is initiated in line number 10 of Table 2A and calls the procedure contained in the exemplary pseudo code of Table 2B. It should be appreciated that the second procedure does not strictly have to be collocated with the code of the first procedure. Furthermore, it should be appreciated that the procedures illustrated in Table 2A and Table 2B may be embedded in a programming library or called from separate programs in accordance with an overall program design.

TABLE 2A

Procedure Compute_Hold_Relationship

BEGIN
Inputs: PSRC, PDST, OFFSET_SRC, OFFSET_DST // PSRC = period of source clock, PDST = period of destination clock, and OFFSET_SRC is the offset of source clock w.r.t time 0, OFFSET_DST is the offset of destination clock w.r.t time 0.
The goal is to find the values of source clock edge time stime and destination clock edge time dtime such that following expression has minimum non-negative value. The minimum non-negative value is the hold time.
PSRC*stime + OFFSET_SRC − PDST*dtime − OFFSET_DST
Inputs: PSRC, PDST, OFFSET 1. psrc = PSRC
   pdst = PDST
   Let offset be the relative offset between destination and source clocks, i.e the effective offset of source clock, assuming destination clock has zero offset.
   Then, offset = OFFSET_SRC − OFFSET_DST // this could be negative
   //now expression expr = psrc*x1 − pdst*x2 + offset, where we need to find x1 and x2.
2. lcm = LCM(psrc, pdst) // this is the base period over which both source clock and destination clock waveforms repeat
3. cg = GCD(psrc, pdst, offset) ) // compute cg as the GCD of the three inputs. This value is used towards computing hold relationship
4. psrc = psrc /cg       // factor out cg from source clock period
   pdst = pdst /cg       // factor out cg from destination clock period
   offset = offset /cg   // factor out cg from the relative offset
   //expr = cg*(psrc*x1 − pdst*x2 + offset)
5. If ( psrc > pdst ) then // if source clock period is greater than destination clock period
        off_r =MOD(offset, pdst) // reduce offset to a value less than pdst
        off_q =DIV(offset, pdst) // This is the number of times offset is greater than pdst. If pdst is greater than offset, then this value is 0
        // expr = psrc*x1 − pdst*(x2 − off_q) + off_r
   else
        off_r = MOD(offset, psrc) // reduce offset to a value less than pdst
        off_q = DIV(offset, psrc) // This is the number of times offset is greater than psrc. If psrc is greater than offset, then this value is 0
        // expr = psrc*(x1 +off_q) − pdst*x2 + off_r
   endif
6. offset = off_r
   // At this point, |offset| is less than pdst and psrc
7. g2 = GCD(psrc, pdst)
8. psrc = psrc/g2
   pdst = pdst/g2
   // expr = g2*(psrc*x1 − pdst*x2) + offset
   Let offset_new = DIV(offset, g2)
   Let tr = MOD(offset, g2)
   // i.e offset = offset_new*g2 + tr
   // Now replace offset by (g2*offset_new + tr) to get below expr
   // expr = g2*(psrc*x1 − pdst*x2 + offset new) + tr
   //Let offset = offset_new
   //Let expr_new = psrc*x1 − pdst*x2 + offset
   //Then expr = g2*expr_new + tr
   // let val represent the value of expr_new
9. If (tr > 0) then
        val = 0
   else
        val = 1
   end if
   // val is set 0 or 1 as appropriate, to get minimum non-negative value of g2*expr_new + tr
10. (dtime, stime) = FIND_EDGES(pdst, psrc, offset, val)
    // find the edge values stime and dtime such that psrc*stime pdst*dtime +offset =val
11. if (tr < 0) then
        hold_value = g2 + tr
    else
        hold_value = tr
12. if ( psrc > pdst) then
        dtime = dtime + off_q
    else
        stime = stime − off_q
    endif
13. hold_value = hold_value*cg
14. stime = stime*PSRC + offset + OFFSET_DST
    dtime = dtime*PDST + OFFSET_DST
    // stime is now translated to the edge time (for reporting to user). This is the edge at time psrc*x1 + offset.
    // Here offset = OFFSET_SRC − OFFSET_DST. Therefore adding OFFSET_DST to it gives OFFSET_SRC
15. stime = MOD(stime, lcm)
    dtime = MOD(dtime, lcm)
16. if ( stime < 0 or dtime < 0) then
        stime = stime + lcm

TABLE 2A-continued

Procedure Compute_Hold_Relationship

```
        dtime = dtime + lcm
    end if
17. Return (hold_value, stime, dtime)
END
```

TABLE 2B

```
Procedure FIND_EDGES
BEGIN
Inputs: psrc, pdst, offset, val
If ( |offset – val| == 0) then return (pdst, psrc).
 5. (se, de) = EXTENDED_P_GCD(-psrc, pdst)
    // extended Greatest Common Divisor method as applied to two
    numbers that are relatively prime, also known as extended Euclidian
    method ( reference: Art of Computer Programming, Volume 2, by
    Donald .E. Knuth, 3rd edition, section 4.5.2.)
 6. se = se*(val – offset)
    de = de*(val – offset)
 7. se = MOD(se, pdst) // reduce to a number less than pdst
    de = MOD(de, psrc) // reduce to a number less than psrc
 8. Return (se, de)
END
```

In accordance with one embodiment of the invention, the methods illustrated in FIG. 1 and FIG. 2 can be contained within a program which computes any of the following: a worst-case setup time, a worst-case hold time, a launching edge time, or a latching edge time. An example of a software application suitable to incorporate the methods of the present invention is QUARTUS™ which is owned by the assignee. It should be understood that the present invention is not limited solely to incorporation within the highlighted software package but can also be incorporated within any suitable EDA software.

Figure 3:
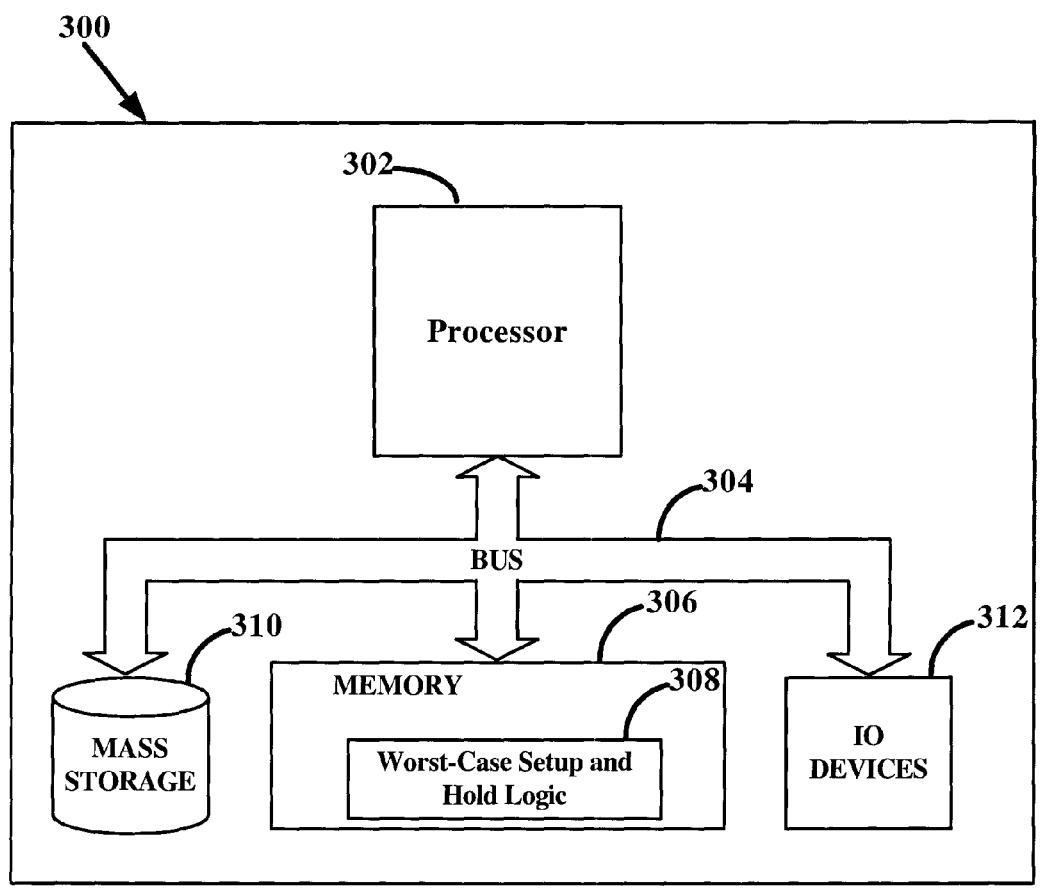
FIG. 3 is a simplified diagram of a system operable to perform the method operations of computing a worst-case setup time, a worst-case hold time, a launching edge time, and a latching edge time in accordance with one embodiment of the invention.

FIG. 3 is a simplified diagram of a system operable to perform the method operations of computing a worst-case setup time, a worst-case hold time, a launching edge time, and a latching edge time in accordance with one embodiment of the invention. System 300 is comprised of processor 302, bus 304, memory 306, worst-case setup and hold logic 308, mass storage 310 and IO devices 312. Processor 302 communicates with memory 308, mass storage 310 and IO devices 312 through bus 304. IO devices 312 can comprise one or more IO devices. Memory 306 further includes worst-case setup and hold logic 308 System 300 is configured such that processor 302 receives instructions which enable computing a worst-case setup time, a worst-case hold time, a launching edge time, and a latching edge time. Worst-Case setup and hold logic 308 conforms with the embodiments illustrated in the previous figures.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for determining a worst-case single cycle setup time between a first and second clock domain comprising method operations of:
    normalizing an offset time of the second clock domain with respect to the first clock domain by subtracting a source clock offset time from a destination clock offset time;
    factoring a first greatest common denominator (FGCD) shared by the first and second clock domains and the normalized second clock domain offset time;
    substituting a reduced offset time and a reduced offset time size factor into an expression representing a relationship between the first and second clock domains, the reduced offset time size factor representing a number of times the reduced offset time is greater than a destination clock period;
    factoring a second greatest common denominator (SGCD) shared by the first and second clock domains from the expression, the factoring including computing a modulus value of the reduced offset time and the SGCD; and
    computing the worst-case single cycle setup time from the modulus value.

2. The method of claim 1, wherein a launching edge time is calculated by computing a delay difference between the first and second clock domain and executing a computational procedure.

3. The method of claim 1, wherein a latching edge time is calculated by computing a delay difference between the first and second clock domain and executing a computational procedure.

4. The method of claim 1, wherein the first and second clock domains and the normalized destination clock offset time are constants of the expression.

5. The method of claim 2, wherein the computational procedure computes an extended greatest divisor of the first and second clock domain which solves a Diophantine equation to determine the launching edge time.

6. The method of claim 2, wherein the computational procedure computes an extended greatest divisor of the first and second clock domain which solves a Diophantine equation to determine the latching edge time.

7. The method of claim 1, wherein the worst-case single cycle setup time is postprocessed to translate the worst-case single cycle setup time in terms of the FGCD.

8. The method of claim 1, wherein the computing the worst-case single cycle setup time from the modulus value includes one of:
adding the SGCD to the modulus value or equating the worst-case single cycle setup time to the modulus value.

9. A method for determining a worst-case single cycle hold time between a first and second clock domain comprising method operations of:
normalizing an offset time of the first clock domain with respect to the second clock domain by subtracting a source clock offset time from a destination clock offset time;
factoring a first greatest common denominator (FGCD) shared by the first and second clock domains and the normalized first clock domain offset time;
substituting a reduced offset time and a reduced offset time size factor into an expression representing a relationship between the first and second clock domains, the reduced offset time size factor representing a number of times the reduced offset time is greater than a destination clock period;
factoring a second greatest common denominator (SGCD) shared by the first and second clock domains from the expression, the factoring including computing a modulus value of the reduced offset time and the SGCD; and
computing the worst-case single cycle hold time from the modulus value.

10. The method of claim 9, wherein the computing the worst-case single cycle hold time from the modulus value includes one of:
adding the SGCD to the modulus value or equating the worst-case single cycle hold time to the modulus value.

11. The method of claim 9, wherein a launching edge time is calculated by computing a delay difference between the first and second clock domain and executing a computational procedure.

12. The method of claim 9, wherein a latching edge time is calculated by computing a delay difference between the first and second clock domain and executing a computational procedure.

13. The method of claim 9, wherein the first and second clock domains and the normalized destination clock offset time are constants of the expression.

14. The method of claim 11, wherein the computational procedure computes an extended greatest divisor of the first and second clock domain which solves a Diophantine equation to determine the launching edge time.

15. The method of claim 12, wherein the computational procedure computes an extended greatest divisor of the first and second clock domain which solves a Diophantine equation to determine the latching edge time.

16. The method of claim 9, wherein the worst-case single cycle hold time is postprocessed to translate the worst-case single cycle hold time in terms of the FGCD.

17. A computer readable medium having program instructions for determining a worst-case single cycle setup time between a first and second clock domain comprising:

program instructions for normalizing an offset time of the second clock domain with respect to the first clock domain by subtracting a source clock offset time from a destination clock offset time;
program instructions for factoring a first greatest common denominator (FGCD) shared by the first and second clock domains and the normalized offset time;
program instructions for substituting a reduced offset time and a reduced offset time size factor into an expression representing a relationship between the first and second clock domains, the reduced offset time size factor representing a number of times the reduced offset time is greater than a destination clock period;
program instructions for factoring a second greatest common denominator (SGCD) shared by the first and second clock domains from the expression, the factoring including computing a modulus value of the reduced offset time and the SGCD; and
program instructions for computing the worst-case single cycle setup time from the modulus value.

18. The computer readable medium of claim 17, wherein a launching edge time is calculated by program instructions for computing a delay difference between the first and second clock domain and executing a computational procedure.

19. The computer readable medium of claim 17, wherein a latching edge time is calculated by program instructions for computing a delay difference between the first and second clock domain and executing a computational procedure.

20. The computer readable medium of claim 17, wherein the computing the worst-case single cycle setup time from the modulus value includes program instructions for one of:
adding the SGCD to the modulus value or
equating the worst-case single cycle setup time to the modulus value.

21. The computer readable medium of claim 17, further including program instructions to compute a worst-case single cycle hold time comprising:
program instructions for normalizing an offset time of the first clock domain with respect to the second clock domain;
program instructions for factoring a third greatest common denominator (TGCD) shared by the first and second clock domains and the normalized first clock domain offset time;
program instructions for substituting a reduced offset time and a reduced offset time size factor into an expression representing a relationship between the first and second clock domains;
program instructions for factoring a fourth greatest common denominator shared by the first and second clock domains from the expression, the factoring including computing a modulus value of the reduced offset time and the fourth greatest common denominator; and
program instructions for computing the worst-case single cycle hold time from the modulus value.

22. The computer readable medium of claim 21, wherein the computing the worst-case single cycle hold time from the modulus value includes program instructions for one of:
adding the fourth greatest common denominator to the modulus value or
equating the worst-case single cycle setup time to the modulus value.

23. A system for computing static timing analysis setup and hold relationships comprising:
a bus;
a memory;

a processor in communication with the memory, through the bus, the processor operable to receive and execute instructions which cause the processor to perform a method comprising:

normalizing an offset time of the second clock domain with respect to the first clock domain by subtracting a source clock offset time from a destination clock offset time;

factoring a first greatest common denominator (FGCD) shared by the first and second clock domains and the normalized second clock domain offset time;

substituting a reduced offset time and a reduced offset time size factor into an expression representing a relationship between the first and second clock domains, the reduced offset time size factor representing a number of times the reduced offset time is greater than a destination clock period;

factoring a second greatest common denominator (SGCD) shared by the first and second clock domains from the expression, the factoring including computing a modulus value of the reduced offset time and the SGCD;

computing the worst-case single cycle setup time from the modulus value; and program instructions for adjusting a circuit design based on the worst-case single cycle setup time.

24. The system of claim 23 wherein the method performed by the processor further comprises:

program instructions for normalizing an offset time of the first clock domain with respect to the second clock domain;

factoring a third greatest common denominator shared by the first and second clock domains and the normalized first clock domain offset time;

program instructions for substituting a reduced offset time and a reduced offset time size factor into an expression representing a relationship between the first and second clock domains;

program instructions for factoring a fourth greatest common denominator shared by the first and second clock domains from the expression, the factoring including computing a modulus value of the reduced offset time and the fourth greatest common denominator;

program instructions for computing the worst-case single cycle setup time from the modulus value; and program instructions for adjusting a circuit design based on the worst-case single cycle hold time.

25. The system of claim 23 wherein the method performed by the processor further comprises:

program instructions for computing a delay difference between the first and second clock and executing a computational procedure to calculate a launching edge time and a latching edge time; and program instructions for adjusting a circuit design based on the launching edge time and the latching edge time.

* * * * *